(12) United States Patent
Li

(10) Patent No.: US 7,006,062 B2
(45) Date of Patent: Feb. 28, 2006

(54) DRIVING CIRCUIT OF DISPLAY

(75) Inventor: Chun-Huai Li, Pingtung Hsien (TW)

(73) Assignee: Au Optronics Corporation, Hsinchu (TW)

( * ) Notice: Subject to any disclaimer, the term of this patent is extended or adjusted under 35 U.S.C. 154(b) by 325 days.

(21) Appl. No.: 10/249,079

(22) Filed: Mar. 14, 2003

(65) Prior Publication Data

US 2003/0179166 A1 Sep. 25, 2003

(30) Foreign Application Priority Data

Mar. 19, 2002 (TW) .............................. 91105146 A

(51) Int. Cl.
*G09G 3/31* (2006.01)

(52) U.S. Cl. ..................... 345/82; 345/205; 345/206

(58) Field of Classification Search ................. 345/82, 345/92, 205, 206
See application file for complete search history.

(56) References Cited

U.S. PATENT DOCUMENTS 6,229,506 B1 * 5/2001 Dawson et al. ............... 345/82

* cited by examiner

*Primary Examiner*—Sumati Lefkowitz
*Assistant Examiner*—Ke Xiao
(74) *Attorney, Agent, or Firm*—Jianq Chyun IP Office

(57) ABSTRACT

A driving circuit of a display which has a plurality of pixels. Each pixel has a first transistor, a second transistor, a third transistor, a fourth transistor, a capacitor and a light-emitting device. Driving the pixels with current is achieved by n-type amorphous silicon thin film, while the low-temperature polycrystalline silicon thin-film transistor is not required. Further, by adjusting the ratio of channel width to channel length of the thin-film transistors of the pixels, the different effects caused by characteristics of red, green and blue pixels are compensated without the need of providing different data current by the driving integrated circuit.

10 Claims, 3 Drawing Sheets

DRIVING CIRCUIT OF DISPLAY

CROSS REFERENCE TO RELATED APPLICATIONS

This application claims the priority benefit of Taiwan application serial no. 91105146, filed Mar. 19, 2002.

BACKGROUND OF THE INVENTION

1. Field of the Invention

The invention relates in general to a display having a current driving circuit. More particularly, the invention relates to a display having an amorphous silicon thin-film transistor ($\alpha$-Si TFT) current driving circuit.

2. Related Art of the Invention

The first dynamic image visible to human being includes the recorded movie. Later on, following the invention of cathode ray tube (CRT), the commercial television is developed, which has now become an inevitable appliance to every household. The further application as the desktop monitor for computer industry outlives the cathode ray tube for several decades. However, the radiation problems and the huge volume occupied by the internal electron gun adverse the trends of being thinner, lighter and large area display.

To resolve the above problems, flat panel displays have been developed. This field comprises liquid crystal displays (LCD), field emission display (FED), vacuum fluorescent display (VFD), organic light-emitting diode (OLDE) and plasma display panel (PDP).

The organic light-emitting diode is also referred as organic electroluminescence display, which is a self-luminescent dot-matrix display. The organic light-emitting device is driven by direct current (DC) voltage and has high intensity, high efficiency, high contrast ratio, and thin and light characteristics. Having theses characteristics and a high degree of freedom from three primary colors, that is, red (R), green (G) and blue (B), to white, the organic light-emitting diode is thus an important flat panel display technique to be developed in the next generation. In addition to the light, thin, and high-resolution properties of the liquid crystal display, the organic light-emitting diode further has the advantage of high speed and low-power cold light source. Other advantages such as wide viewing angle, effective color contrast, and low cost are also provided. The organic light-emitting diode can be applied to cellular phone, digital camera, personal data assistant, and the larger area display.

From the driver viewpoint, the organic light-emitting diode can be divided into a passive matrix driving type and an active matrix driving type. The passive matrix driving type is advantageous in its simple structure, of which the thin-film transistor (TFT) is not required. However, its drawback includes the inapplicability of obtaining high-resolution image quality. When the display is developed with a large area, the power consumption is increased, the lifetime is shortened, and the display performance is poor. Other the other hand, the active matrix type organic light-emitting diode has the active driving matrix applicable to large-size display. Further, the viewing angle is wide, the contrast is high, and the response speed is fast. However, the cost is slightly higher than the passive matrix driving type organic light-emitting diode.

For the active matrix driving type organic light-emitting diode, the pixels are typically driven by current. Currently, the current driving method of the active matrix organic light-emitting diode has to incorporate the production technique of low-temperature polysilicon (LTPS) thin-film transistor since which are mainly constructed by p-type or p-type and n-type thin-film transistors. The low-temperature polysilicon thin-film transistors have the characteristics of high mobility of electrons and holes and providing the p-channel; therefore, a driving current larger than that of the amorphous silicon thin-film transistor is provided. For the amorphous silicon, a proper p-channel thin-film transistor cannot be fabricated, so that the current driving method cannot be applied to the pixels thereof. Further, in the current-driving circuit, the driving current and data current are about the same, so that an driving integrated circuit (IC) is required to provide different data currents, so as to compensate the effects caused by different characteristics for the R, G and B pixels.

SUMMARY OF THE INVENTION

The present invention provides a driving circuit for a display. An n-type amorphous silicon ($\alpha$-Si) thin-film transistor is used for forming the driving circuit instead of the low-temperature polysilicon thin-film transistor. By adjusting the ratio of channel width to channel length for the thin-film transistor of the pixel, the effects caused by different characteristics of the red pixel, the green pixel and the blue pixel are compensated without applying different data currents from a driving IC.

The present invention thus provides a driving circuit of a display having a plurality of pixels, each of which further comprises a first transistor, a second transistor, a third transistor, a fourth transistor, a capacitor and a light-emitting device. The first transistor has a first drain, a first gate and a first source. The first drain is coupled to a data signal electrode which outputs a data current. The first gate is coupled to a scan line. The second transistor comprises a second drain, a second gate and a second source. The second drain is coupled to the first source, and the second gate is coupled to the scan line and the first gate. The third transistor has a third drain, a third gate and a third source. The third drain is coupled to the first source and the second drain, and the gate is coupled to the second source. The fourth transistor has a fourth drain, a fourth gate and a fourth source. The fourth drain is coupled to a power supply which outputs a positive voltage VDD, the fourth gate is coupled to the second source and the third gate, and the fourth source is coupled to the third source. The capacitor has a first terminal and a second terminal, where the first terminal is coupled to the second source, the third gate and the fourth gate, and the second terminal is coupled to the third source and the fourth source. The light-emitting device has a positive electrode coupled to the third source, the fourth source and the second terminal, and a negative electrode coupled to ground.

In one embodiment of the invention, by adjusting the ratio of the channel width to channel length of the third transistor and the fourth transistor, the driving current of the fourth transistor is different from the data current thereof.

The one embodiment of the invention, the light-emitting device includes an organic light-emitting diode or a polymer light-emitting diode.

Further, the first transistor, the second transistor, the third transistor and the fourth transistor include n-type amorphous silicon thin-film transistors.

The invention further provides a driving circuit of a display. The display comprises a plurality of pixels, each of which further comprises a first transistor, a second transistor, a third transistor, a fourth transistor, a capacitor and a light-emitting diode. The first transistor has a first drain, a first gate and a first source. The first drain is coupled to a data signal electrode which outputs a data current. The first gate is coupled to a scan line. The second transistor comprises a second drain, a second gate and a second source. The second drain is coupled to the data current and the first drain, and the second gate is coupled to the scan line and the first gate. The third transistor has a third drain, a third gate and a third source. The third drain is coupled to the first source, and the third gate is coupled to the second source. The fourth transistor has a fourth drain, a fourth gate and a fourth source. The fourth drain is coupled to a power supply which outputs a positive voltage. The fourth gate is coupled to the second source and the third gate. The fourth source is coupled to the third source. The capacitor has a first terminal and a second terminal, where the first terminal is coupled to the second source, the third gate and the fourth gate, while the second terminal is coupled to the third source and the fourth source. The light-emitting device has a positive electrode and a negative electrode. The positive electrode is connected to the third source, the fourth source, and the second terminal, while the negative electrode is coupled to the ground.

Accordingly, the present invention uses the amorphous silicon thin-film transistor to achieve driving pixels with current instead of using low-temperature polysilicon thin-film transistor. By adjusting the ratio of channel width to channel length of the thin-film transistor of the pixel itself, the different effects caused by the red, green and blue pixels are compensated without using driving integrated circuit to provide different data current.

BRIEF DESCRIPTION OF DRAWINGS

These, as well as other features of the present invention, will become more apparent upon reference to the drawings wherein.

DETAILED DESCRIPTION

Figure 1:
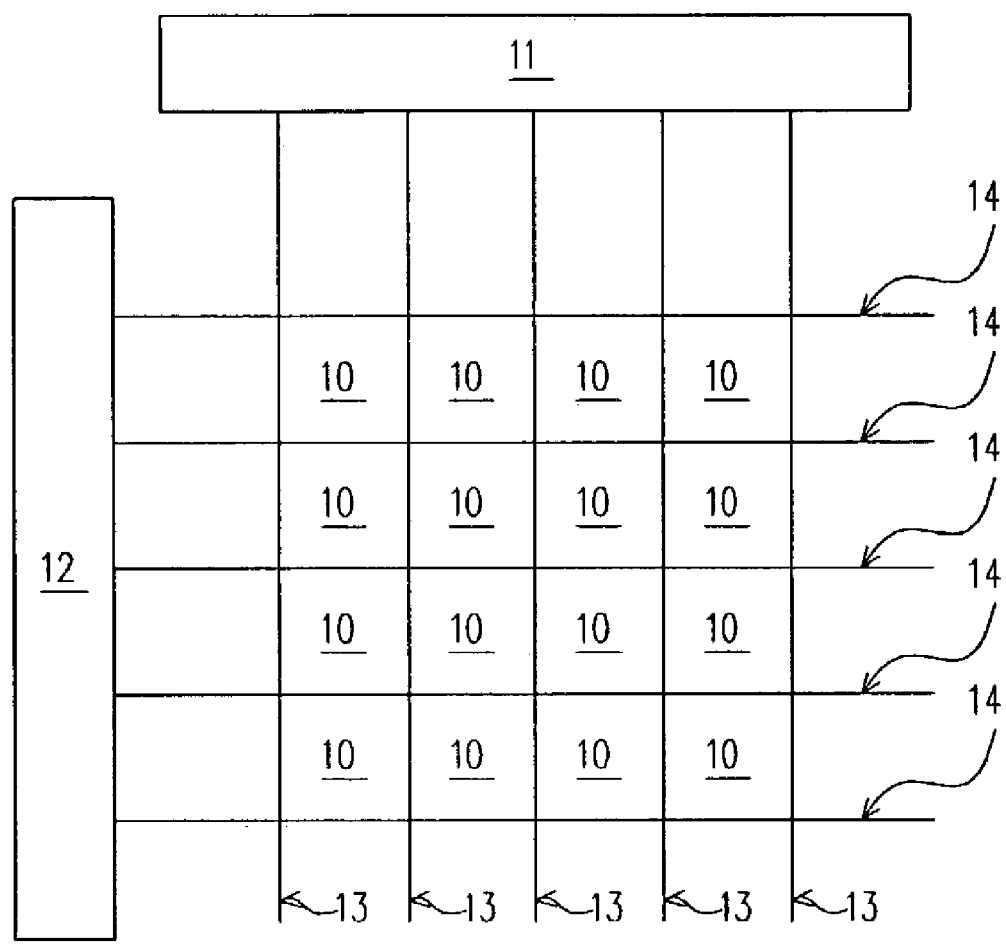
FIG. 1 shows the structure of a driving circuit of a display according to the present invention.

Referring to FIG. 1, a preferred embodiment of a driving circuit of a display according to the present invention is shown. The driving circuit has an array structure including a data signal electrode 11, a scan signal electrode 12, data lines 13, and scan lines 14. In this embodiment, the data signal electrode 11 provides current to the data lines 13, while the scan signal electrode 12 provides current to the scan lines 14. Each of the data lines 13 and each of the scan lines 14 construct a pixel 10.

Figure 2:
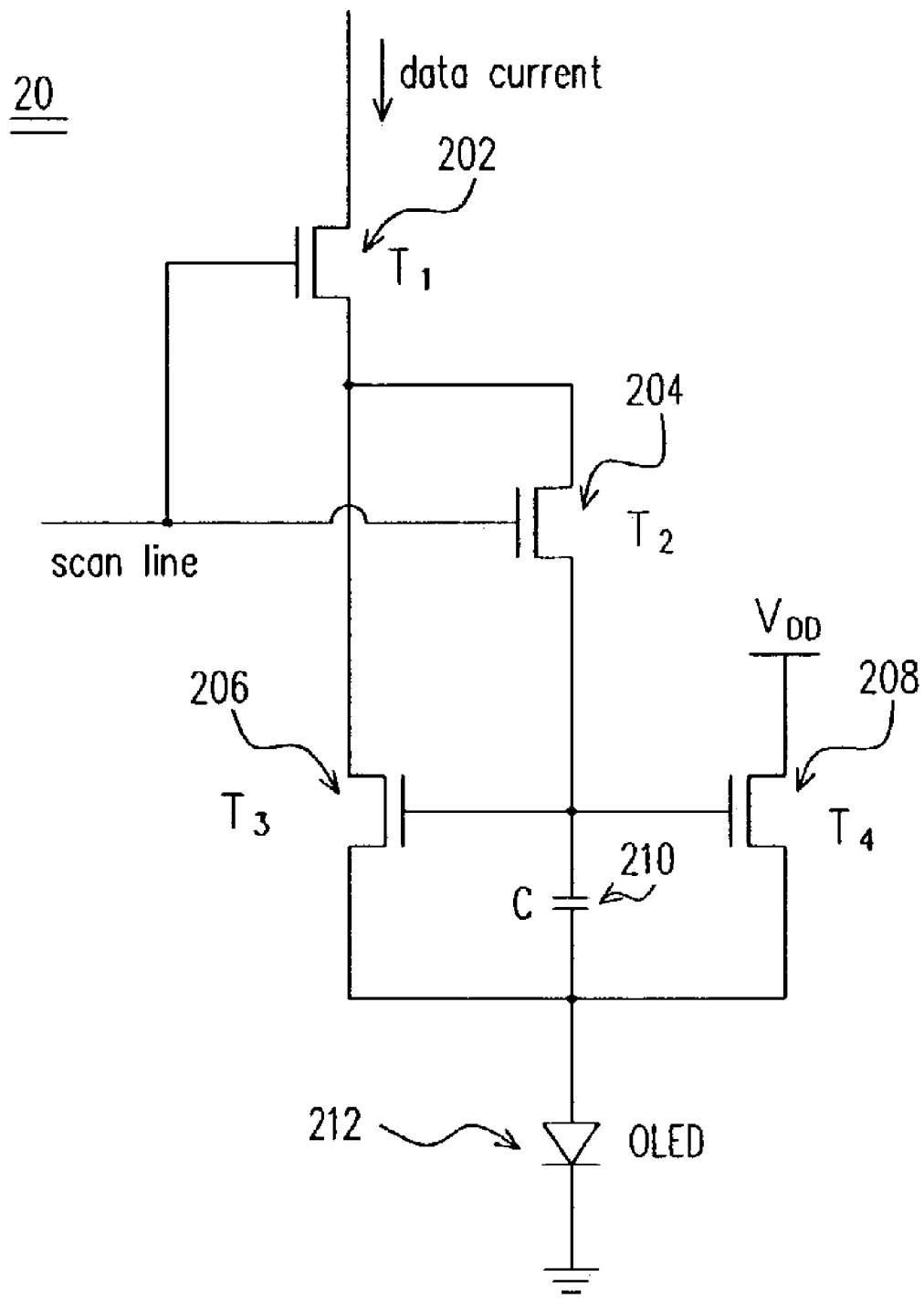
FIG. 2 shows a circuit diagram of the pixel in the driving circuit of the display.

Referring to FIG. 2, the circuit diagram of each pixel 20 in the driving circuit of the display is shown. The pixel 20 includes a transistor T1 (202), a transistor T2 (204), a transistor T3 (206), a transistor T4 (208), a capacitor C (210) and an organic light-emitting diode 212. The transistors T1, T2, T3 and T4 are all n-type amorphous thin-film transistors. The following will describe the structure of the pixel 20.

The transistors T1 (202), T2 (204), T3 (206) and T4 (208) are tripolar devices, each having a drain, a gate and a source. The capacitor C (210) has a first terminal and a second terminal. The organic light-emitting diode 212 has a positive electrode and a negative electrode. The drain of the transistor T1 (202) is coupled to the data signal electrode to receive a data current output thereby. The gates of the transistors T1 (202) and T2 (204) are coupled to the scan lines. The source of the gate T1 (202) is coupled to the drains of the transistors T2 (204) and T3 (206). The source of the transistor T2 (204) is coupled to the gates of the transistors T3 (206) and T4 (208), and the first terminal of the capacitor C (210). The source of the transistor T3 (206) is coupled to the source of the transistor T4 (208), the second terminal of the capacitor C (210) and the positive terminal of the organic light-emitting diode 212. The drain of the transistor T4 (208) is coupled to a power supply which outputs a positive voltage VDD. The negative electrode of the organic light-emitting diode 212 is coupled to the ground.

The operation of the pixel 20 is described as follows. In this embodiment, the data current is set as 1 mA, and the transistors T3 (206) and T4 (208) have the same threshold voltage. When the scan line is set up at a high voltage level, the voltage Vgs1 across the gate and source of the transistor T1 (202) is higher than the threshold voltage of the transistor T1 (202), and the voltage Vgs2 across the gate and source of the transistor T2 (204) is higher than the threshold voltage of the transistor T2 (204). As a result, the transistors T1 (202) and T2 (204) are switched on. Meanwhile, the data current flows through the transistors T1 (202) and T2 (204) to charge the capacitor C (210). When the charged voltage of the capacitor C (210) reaches the threshold voltage of the transistor T3 (206), the transistor T3 (206) is conducted, and the data current of 1 mA flows through the transistor T3 (206). Since the threshold voltage of the transistor T4 (208) is the same as that of the transistor T3 (206), the transistor T4 (208) is also conducted, and a driving current is flowing therethrough. With the voltage charged by the capacitor C (210), the voltage Vgs3 across the gate and the source of the transistor T3 (206) is the same as the voltage Vsg4 across the gate and the source of the transistor T4 (208). Assuming that the transistors T3 (206) and T4 (208) have the same ratio of channel width to channel length, the driving current for the transistor T4 (208) is also 1 mA. In this embodiment, when the transistors T3 and T4 are conducted, the current driving the organic light-emitting diode (212) reaches 2 mA in a transient. When the scan lines are set at a low voltage level, the transistor T1 (202) and the transistor T2 (204) are switched off. Meanwhile, no current if flowing through the transistors T3 (206), while voltage charged by the capacitor C (210) is maintained the driving current of the transistor T4 (208) with the previous value, so that the organic light-emitting diode 212 is continuously driven. The driving current of the organic light-emitting diode 212 is the same as that of the transistor T4 (208), which is 1 mA. Since the organic light-emitting diode 212 itself has the capacitor characteristic, the transient 2 mA current is advantageous to the charging process thereof, and the organic light-emitting diode can reaches a saturated status in a faster speed.

The drain current of the transistor in the saturation region is:

$$Id = (½) \times u^n \times Cox(W/L) \times [(Vgs - Vth)^2]$$

Where $u^n$ is the electron mobility, the gate capacitance per unit area Cox is constant, Vth is the threshold voltage of the transistor, W is the channel width of the transistor, and L is the channel length of the transistor. It is know from the above formula that as Vgs3=Vgs4, the current ratio between the transistors T3 (206) and T4 (208) is varied by adjusting the ratio of the channel width to the channel length of the transistors T3 (206) and T4 (208). Therefore, by adjusting the ratio of channel width/channel length of the transistors T3 (206) and T4 (208), the driving current is different from the data current of the transistor T4 (208). The various effects caused by the red, green and blue device characteristics can thus be compensated. In contrast, in the prior art, a driving integrated circuit is used to provide different data currents, so as to compensate the different effects caused by the red, green and blue device characteristics of the organic light-emitting diode display. It is to be noted that the function of the transistor T1 (202) is to select the scan lines through which the data current will flow. When the transistor T2 (204) is set up at a high voltage level, the capacitor C (210) is charged. When the scan line is set at a low voltage level, the capacitor C (210) is prevented from discharging, such that the Vgs4 of the transistor T4 (208) is maintained.

Figure 3:
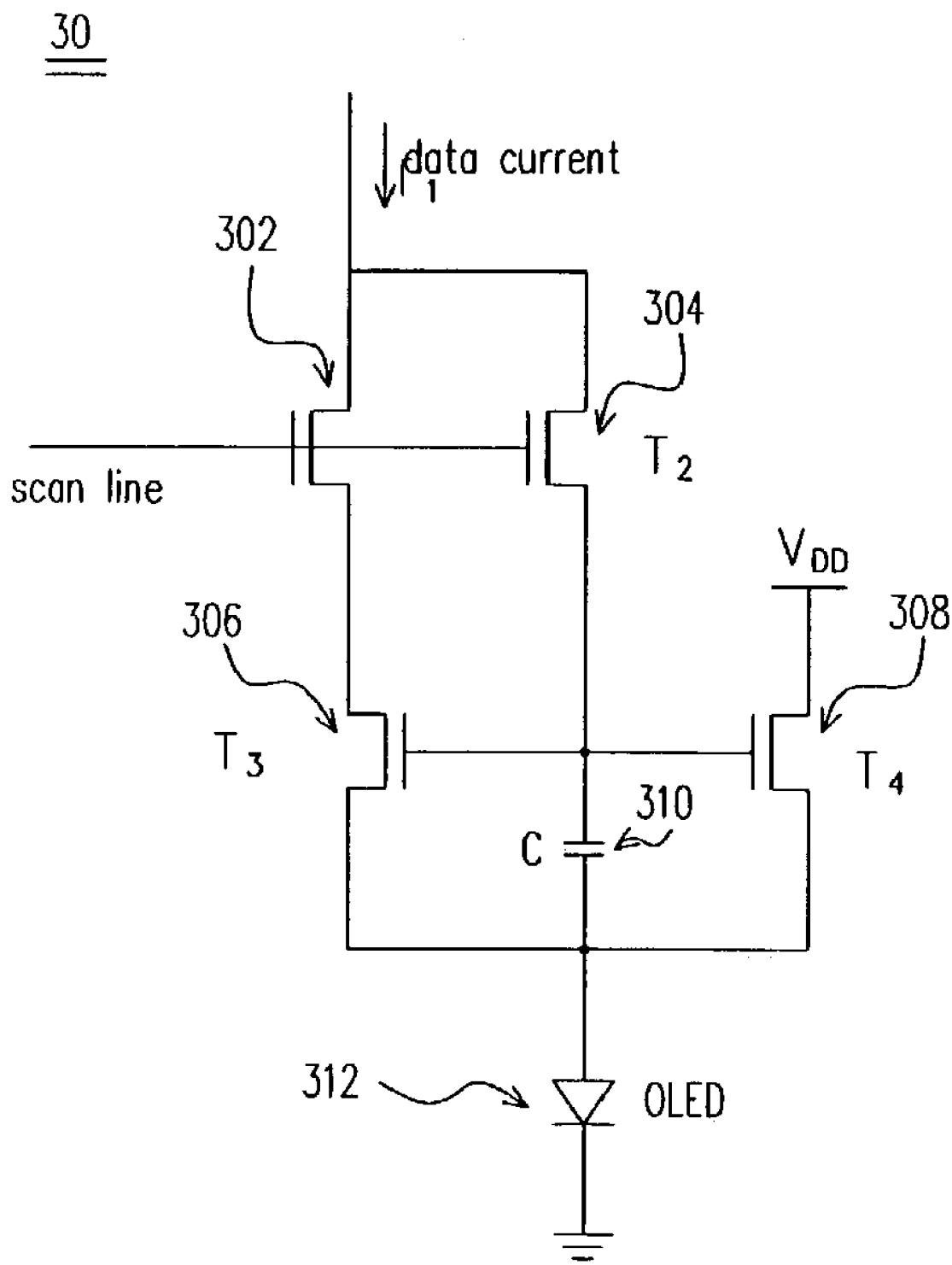
FIG. 3 shows a circuit diagram of the pixel in the driving circuit of the display in another embodiment.

In the second embodiment of the present invention, the circuit diagram of each pixel 30 of the driving circuit for the display is shown in FIG. 3. The pixel 30 includes transistors T1 (302), T2 (304), T3 (306) and T4 (208), a capacitor C (310) and an organic light emitting diode 312. The transistors T1 (302), T2 (304), T3 (306) and T4 (308) are all n-type amorphous silicon thin-film transistors. The structure of the pixel 30 is described as follows.

The transistors T1 (302), T2 (304), T3 (306) and T4 (308) are all tripolar devices each with a drain, a source and a gate. The capacitor C (310) has a first terminal and a second terminal. The organic light-emitting diode 312 has a positive electrode and a negative electrode. The drain of the transistor T1 (302) is coupled toe the drain of the transistor T2 (304) and a data signal electrode to receive the data current output therefrom. The gates of the transistors T1 (302) and T2 (304) are coupled to the scan lines. The source of the transistors T1 (302) is coupled to the drain of the transistor T3 (306). The source of the transistor T2 (304) is coupled to the gates of the transistors T3 (306), T4 (308) and the first terminal of the capacitor C (310). The source of the transistor T3 (306) is coupled to the source of the transistor T4 (208), the second terminal of the capacitor C (310) and the positive electrode of the organic light-emitting diode 312. The drain of the transistor T4 is coupled to a power supply that outputs a positive voltage VDD. The negative electrode of the organic light-emitting diode 312 is coupled to ground.

Comparing the structure in the first embodiment (FIG. 2), the structure of second embodiment as shown FIG. 3 is different from that of the first embodiment in the parallel connection of the transistors T1 (302) and T2 (304). From the function viewpoint, difference between two embodiments includes that when the scan lines of the second embodiment is set at a high voltage level (for example, 15 V), the gates of the transistors T1 (302) and T2 (304), and the source voltage difference Vgs all can reach 15 V. While in the first embodiment, only the sum of the voltage difference Vgs1 across the gate and source of the transistor T1 (202) and the voltage difference Vgs2 across gate and source of the transistor T2 (204) reaches the 15 V when the scan lines is set at such level. Therefore, the current flowing through the transistors 302 and 304 is higher than that flowing through the transistors 202 and 204. As a result, the driving current of the organic light-emitting diode 302 in the second embodiment is higher than that of the organic light-emitting diode 202 in the first embodiment, while other functions between the two embodiments are basically the same.

According to the above embodiments, the present invention uses n-type amorphous silicon thin-film transistors to achieve driving the pixel with current without using the low-temperature polysilicon thin-film transistor. By adjusting the channel width and length ratio of the pixel of the thin-film transistor, the different effects caused by red, green and blue pixel characteristics are compensated without using the driving IC to provide various data current.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A driving circuit of a display, wherein the display comprises a plurality of pixels, and each pixel further comprises:
    a first transistor, having a first drain, a first gate and a first source, wherein the first gate is coupled to a scan line, and the first drain is coupled to a data signal electrode which outputs a data current;
    a second transistor, having a second drain, a second gate and a second source, wherein the second drain is coupled to the first source, and the second gate is coupled to the scan line and the first gate;
    a third transistor, having a third drain, a third gate and a third source, wherein the third drain is coupled to the first source and the second drain, and the third gate is coupled to the second source;
    a fourth transistor, having a fourth drain, a fourth gate and a fourth source, wherein the fourth drain is coupled to a power supply which has a voltage level VDD, the fourth gate is coupled to the second source and the third gate, and the fourth source is coupled to the third source;
    a capacitor, having a first terminal and a second terminal, wherein the first terminal is coupled to the second source, the third gate and the fourth gate, and the second terminal is coupled to the third and the fourth sources; and
    a light-emitting device, having a positive electrode and a negative electrode, wherein the positive electrode is coupled to the third source, the fourth source and the second terminal of the capacitor.

2. The driving circuit as recited in claim 1, wherein current flowing through the fourth transistor is different from the data current by adjusting ratios of channel width and length of the third and fourth transistors.

3. The driving circuit as recited in claim 1, wherein the light-emitting device includes an organic light-emitting diode.

4. The driving circuit as recited in claim 1, wherein the light-emitting device includes a polymer light-emitting diode.

5. The driving circuit as recited in claim 1, wherein the first, second, third and fourth transistors are n-type amorphous silicon transistors.

6. A driving circuit for a display which comprises a plurality of pixels, wherein each of the pixels comprises:
    a first transistor, having a first drain, a first gate and a first source, wherein the first gate is coupled to a scan line, and the first drain is coupled to a data signal electrode which outputs a data current;
    a second transistor, having a second drain, a second gate and a second source, wherein the second drain is coupled to the data signal electrode and the first drain, and the second gate is coupled to the scan line and the first gate;
    a third transistor, having a third drain, a third gate and a third source, wherein the third drain is coupled to the first source and the second drain, and the third gate is coupled to the second source;

a fourth transistor, having a fourth drain, a fourth gate and a fourth source, wherein the fourth drain is coupled to a power supply which has a voltage level VDD, the fourth gate is coupled to the second source and the third gate, and the fourth source is coupled to the third source;

a capacitor, having a first terminal and a second terminal, wherein the first terminal is coupled to the second source and the third gate and the fourth gate, and the second terminal is coupled to the third and the fourth sources; and a light-emitting device, having a positive electrode and a negative electrode, wherein the positive electrode is coupled to the third source, the fourth source and the second terminal of the capacitor.

7. The driving circuit as recited in claim 6, wherein current flowing through the fourth transistor is different from the data current by adjusting ratios of channel width and length of the third and fourth transistors.

8. The driving circuit as recited in claim 6, wherein the light-emitting device includes an organic light-emitting diode.

9. The driving circuit as recited in claim 6, wherein the light-emitting device includes a polymer light-emitting diode.

10. The driving circuit as recited in claim 6, wherein the first, second, third and fourth transistors are n-type amorphous silicon transistors.

* * * * *